United States Patent
Shinn

(10) Patent No.: US 10,368,456 B2
(45) Date of Patent: Jul. 30, 2019

(54) LOW CLOSURE FORCE GASKET

(71) Applicants: Bosch Automotive Service Solutions Inc., Warren, MI (US); Robert Bosch GmbH, Stuttgart (DE)

(72) Inventor: Michael G Shinn, Santa Barbara, CA (US)

(73) Assignees: Bosch Automotive Service Solutions Inc., Warren, MI (US); Robert Bosch GmbH, Stuttgart (DE)

( * ) Notice: Subject to any disclaimer, the term of this patent is extended or adjusted under 35 U.S.C. 154(b) by 351 days.

(21) Appl. No.: 14/985,881

(22) Filed: Dec. 31, 2015

(65) Prior Publication Data

US 2017/0196110 A1    Jul. 6, 2017

(51) Int. Cl.
| | |
|---|---|
| *H05K 5/06* | (2006.01) |
| *F16J 15/02* | (2006.01) |
| *H05K 5/00* | (2006.01) |
| *F16J 15/06* | (2006.01) |
| *H05K 1/00* | (2006.01) |

(52) U.S. Cl.
CPC ............ *H05K 5/061* (2013.01); *F16J 15/022* (2013.01); *F16J 15/061* (2013.01); *H05K 1/00* (2013.01)

(58) Field of Classification Search
CPC ........ H05K 5/061; H05K 1/00; H05K 5/0013; F16J 15/022; F16J 15/061
See application file for complete search history.

(56) References Cited

FOREIGN PATENT DOCUMENTS

| CN | 2423607 Y | 3/2001 |
|---|---|---|
| CN | 203086897 U | 7/2013 |
| CN | 203446152 U | 2/2014 |
| CN | 203934215 U | 11/2014 |
| DE | 102007002527 | * 7/2008 |
| DE | 102007002527 A1 | 7/2008 |
| JP | 2004084215 A | 3/2004 |
| SU | 1444972 A1 | 12/1988 |

OTHER PUBLICATIONS

National Intellectual Property Administration, P. R. China Search Report corresponding to Chinese Patent Application No. 201611255496.2 (3 pages).

* cited by examiner

*Primary Examiner* — Yan Lan
(74) *Attorney, Agent, or Firm* — Maginot Moore & Beck LLP

(57) ABSTRACT

A clamshell housing includes a first housing part defining having a first interface edge and a first rib that protrudes from the first interface edge, and a second housing part having a second interface edge and a second rib that protrudes from the second interface edge. An elastomeric gasket is interposed between the first interface edge and the second interface edge. The gasket has a first groove configured to receive the first rib and a second groove configured to receive the second rib. The first rib is configured to form a seal with the first groove, and the second rib is configured to form a seal with the second groove.

8 Claims, 2 Drawing Sheets

LOW CLOSURE FORCE GASKET

TECHNICAL FIELD

The disclosure relates generally to enclosures, or housings, for tools and electronic devices and the like, having two part, clamshell-type housings, and, in particular, to gaskets for sealing the interface between the housing parts.

BACKGROUND

The housings for electronic devices and power tools often have a clamshell configuration in which the housing comprises two housing parts, or shells. The housing parts are fastened together, e.g., by fasteners, such as screws or bolts, and cooperate to define a portion of an interior space, or compartment, within the housing in which the components of the device are arranged. It is important that the interface between the housing parts be sealed to prevent dust, dirt, liquids, and other contaminants like from entering the housing via the interface.

The method currently used to seal clamshell type housings typically involves the use of a solid or hollow o-ring or other elastomeric shape. The o-ring is arranged at the interface between the housing parts. In order to establish a seal, the o-ring must be compressed between the edges of the housing parts within enough force (referred to herein as closure force) to compress the o-ring so as to ensure sufficient compliance between the o-ring and the edges of both housing parts to form an effective seal.

The closure force is typically required to be generated by the fasteners that are used to attach the housing parts together. While this method can be effective in sealing the interfaces of housings and preventing contamination of the interior of the housing, the o-rings or gaskets traditionally used require a significant amount of closure force to establish and maintain the seal. The use of many fasteners is typically required to generate sufficient closure force for the seal. The cost and time for the assembly of the housing increases greatly with the use of a large number of mechanical fasteners. In addition, the closure force is transferred to the o-ring or gasket through the housing parts themselves. A high closure force therefore can result in a high amount of stress on the housing which can reduce the useful lifetime of the parts.

What is needed is a system and method of sealing the housing parts of a clamshell type housing that requires less closure force to establish and maintain a seal at the interface of the housing parts and that reduces the number of fasteners required to secure the housing parts together.

SUMMARY

According to one embodiment of the present disclosure, a housing includes a first housing part defining a first interior housing portion and having a first interface edge that surrounds the first interior housing portion. The first interface edge has a first gasket facing surface and a first rib that protrudes from the first gasket facing surface around an entire perimeter of the housing. A second housing part defines a second interior housing portion and has a second interface edge that surrounds the second interior housing portion. The second interface edge is configured complementarily with respect to the first interface edge. The second interface edge has a second gasket facing surface and a second rib that protrudes from the second gasket facing surface around the entire perimeter. A gasket is configured to be interposed between the first interface edge and the second interface edge around an entire perimeter of the housing. The gasket has a first housing facing surface that faces in a first direction and a second housing facing surface that faces in a second direction that is opposite the first direction. The first housing facing surface defines a first groove shaped complementarily with respect to the first rib, and the second housing facing surface defines a second groove shaped complementarily with respect to the second rib.

In one embodiment, the first and second housing parts are formed of a hard, plastic material. In another embodiment, the housing parts are formed of metal. The first rib may be formed integrally with the first housing part, and the second rib may be formed integrally with the second housing part, for example, by injection molding. The gasket is formed of an elastomeric material. The housing parts may be secured to each other by fasteners, such as screws or bolts.

The first rib is configured to form a seal with the first groove, and the second rib is configured to form a seal with the second groove. To facilitate the formation of a seal that requires little to no force to establish and maintain, the first rib has a width that is slightly greater than a width of the first groove, and the second rib has a width that is slightly greater than a width of the second groove. This results in a type of interference fit or friction fit engagement between the first rib and the first groove and between the second rib and the second groove. The gasket material is displaced laterally by the ribs when the ribs are pressed into the grooves. Pressing the ribs into the grooves is the only force required to establish the seal.

DETAILED DESCRIPTION

Figure 1:
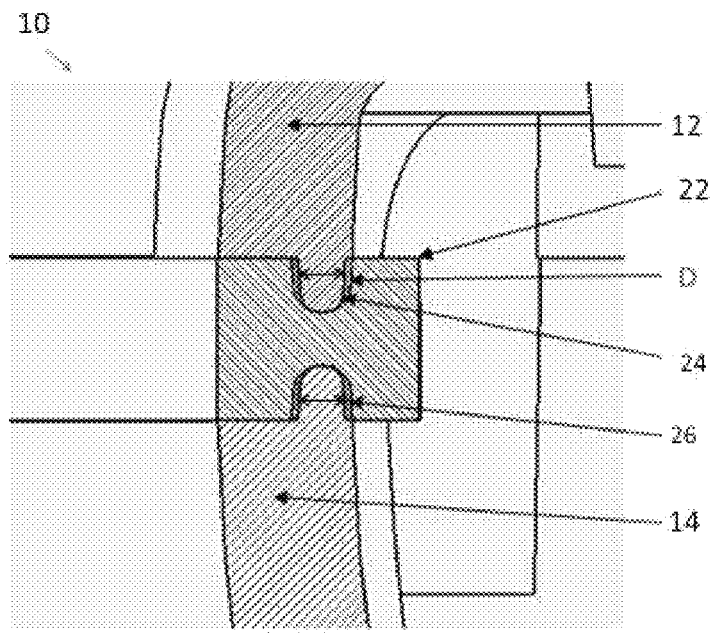
FIG. 1 is a partial, fragmentary, cross-sectional view of an interface between two parts of a housing showing the edges of two housing parts with a gasket arranged therebetween in accordance with the disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

Figure 2:
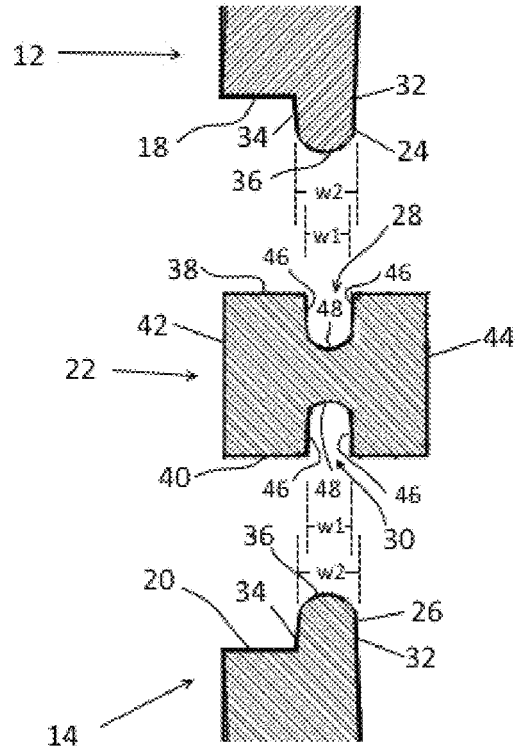
FIG. 2 is an exploded view of the parts of FIG. 1.
Figure 3:
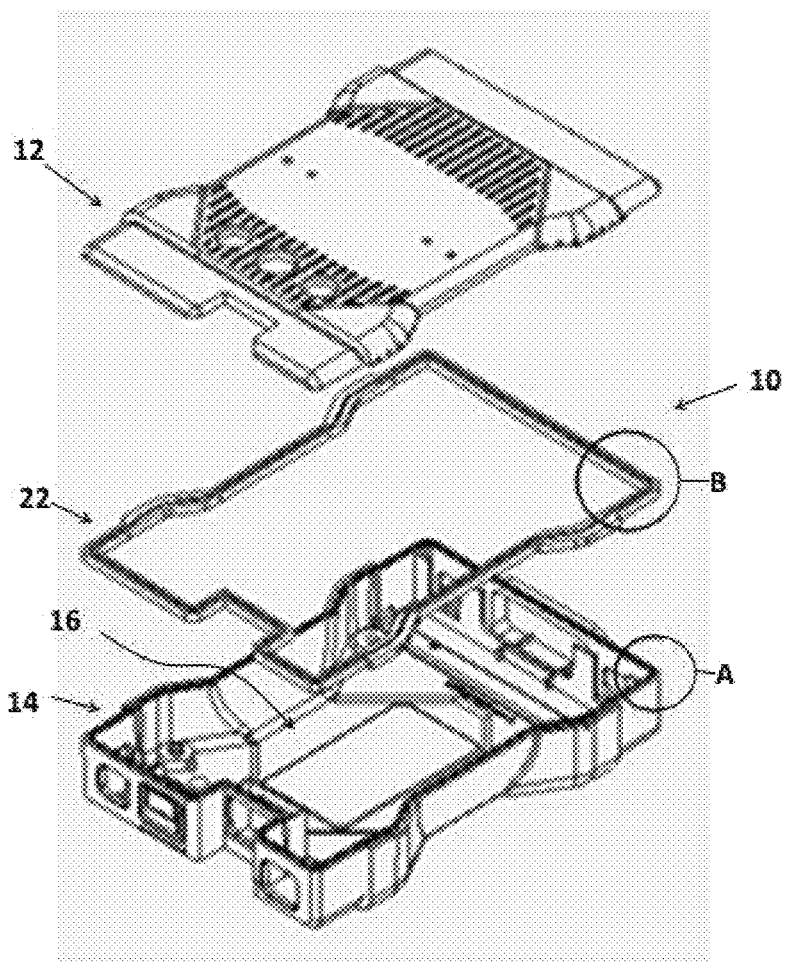
FIG. 3 is a perspective, exploded view of an embodiment of a housing having the sealing configuration of FIG. 1.
Figure 4:
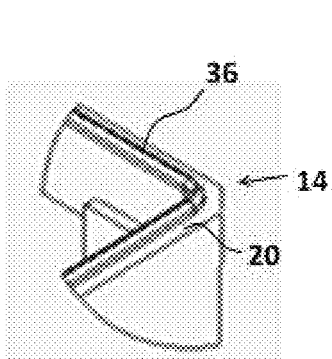
FIG. 4 is a closer view of the portion of the lower housing part of FIG. 1 delimited by the circle labeled A.
Figure 5:
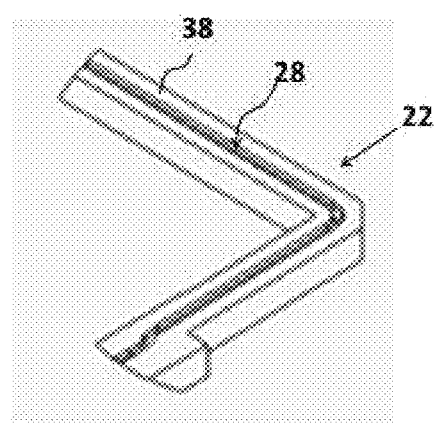
FIG. 5 is a closer view of the portion of the gasket of FIG. 1 delimited by the circle labeled B.

An embodiment of a housing 10 having a sealing configuration in accordance with the present disclosure is depicted in FIGS. 1-5. The housing 10 has a clamshell configuration including a first housing part 12 and a second housing part 14. The first and second housing parts 12, 14 cooperate to define an interior space 16 when the housing parts are fastened together. The exterior shape and the interior space can be designed various purposes depending on the application. For example, FIGS. 3-5 depict one example of a housing. The housing of FIGS. 3-5 can be used for a handheld electronic device, such as a sensing or measuring instrument or a remote control in which case the interior space can include electronic circuitry, such as wiring, circuit boards, and the like, implementing sensors and other functionality as needed. In other embodiments, the housing may be provided in a variety of different shapes, including regular and irregular shapes, and may be used for other types of devices and equipment including lab instruments, video games, computers, power tools, and the like.

The housing parts 12, 14 are formed of a rigid, durable material(s), such as hard plastic although any suitable material can be used including metal. When the housing parts 12, 14 are fastened together, the edges the housing parts meet at an interface. The edges that form the interface are referred to herein as interface edges 18, 20. The interface edges 18, 20 of the housing parts are mirror-shaped with respect to each other and form continuous perimeters around their respective portion of the housing. In the embodiment of FIGS. 1-5, the interface edges 18, 20 are substantially planar in that each interface edge lies substantially in a single plane. In alternative embodiments, the interface edges 18, 20 may include complementarily non-planar shapes that do not lie in a single plane.

A gasket 22 is positioned between the interface edges 18, 20 of the first housing part 12 and the second housing part 14. The gasket 22 is formed of an elastomeric material, such as silicone and/or rubber, and is used to form a seal between the interface edges 18, 20 to prevent ingress of fluids and dirt into the housing via the interface. The gasket 22 and the interface edges of the housing part are configured to form a seal which requires lower closure force and consequently fewer screw fasteners to create the seal. The seal is formed by configuring the gasket 22 and the interface edges 18, 20 of the housing parts 12, 14 to have a tongue and groove configuration. The tongue is formed by ribs 24, 26 which are provided on the interface edges 18, 20. The ribs protrude from the interface edges and extend around the entire perimeter of the housing parts. The ribs may be formed integrally with the housing parts in which case the ribs are formed of the same material as the housing parts, e.g., plastic or metal. When plastics are used, the ribs may be formed with the housing, for example, by injection molding.

As can be seen in FIG. 1, each interface edge 18, 20 comprises a planar, gasket-facing surface. The gasket-facing surfaces 18, 20 are arranged substantially parallel to each other and facing toward each other. In the embodiment of FIGS. 1 and 2, the interface edges include an outboard portion located outboard of the rib 24, 26 and may include, but does not require, an inboard portion located inboard of the rib. The interface edges of the housing parts in FIGS. 1 and 2 do not include an inboard portion. The outboard portion of the base surface plays a more important part in sealing the interface than the inboard portion.

Each interface edge 18, 20 includes a rib 24, 26 that protrudes from the gasket-facing surface toward the other housing part. Each rib 24, 26 is formed by two outwardly facing sidewalls 32, 34 and a rounded, or arcuate, top portion 36. The sidewalls 32, 34 are arranged substantially perpendicularly with respect to the gasket-facing surface 18, 20 and parallel with respect to each other. There may be a slight draft, i.e. taper, as is known in the art if the parts are molded in order to facilitate removal from the mold. The distance from the gasket-facing surface 18, 20 to the outermost tip of the top portion 36 defines the height of the rib 24, 26. The distance between the sidewalls 32, 34 defines the width of the rib. The ribs may have any suitable height and width depending in part on the size and shape of the grooves in the gasket.

The gasket 22 includes grooves 28, 30 in which the ribs 24, 26 are received. The gasket 22 includes a first housing facing surface 38 and a second housing facing surface 40 which are generally parallel to each other and on opposing sides of the gasket 22. The gasket also has an outer edge 42 and an inner edge 44. The width of the gasket 22 is defined between the outer and the inner edges 42, 44. In the embodiment of FIGS. 1, the gasket 22 has a width between the outer edge and the inner edge that is greater than the width of the interface edges of the housing parts. As can be seen in FIG. 1, the outer edge of the gasket is substantially aligned with the outer surfaces of the housing parts when assembled. The gasket extends inwardly beyond the inner surface of the housing walls and protrudes into the interior of the housing. Allowing the gasket to protrude into the interior of the housing rather than outwardly enables a single gasket size to be used with different housing wall thicknesses while also limiting damage to the gasket that could occur if the gasket protruded from the exterior of the housing where it could get snagged or caught on objects and torn.

The thickness of the gasket is defined between the first housing facing surface 38 and the second housing facing surface 40. Each of the first and the second housing facing surfaces 38, 40 defines one of the grooves 28, 30. Each groove 28, 30 comprises a pair of generally parallel inwardly facing surfaces 46 and a rounded, or arcuate, bottom surface 48. The gasket 22 may be formed by injection molding. Therefore, there may be a slight draft to facilitate removal from a mold.

The distance between side surfaces 46 of the grooves 28, 30 defines the width of the groove, and the distance between the housing facing surface 38, 40 and the corresponding bottommost portion 48 of the groove defines the depth of the groove. The width and depth of the groove is configured to correspond to the width and height of the rib that is to be received in the groove. The depth of the groove can be substantially equal to the height of the rib. The depth of the groove and the height of the rib can deviate from each other so long as sufficient engagement between the housing facing surface of the gasket and the gasket facing surface of the housing to form an effective seal when the rib is seated in the groove.

To assemble the housing 10, the gasket 22 is installed on one of the housing parts, e.g. the second housing part 14, by positioning the second housing facing surface 40 against the second gasket facing surface 20 of the interface edge of the second housing part 14. The rib 26 is aligned with the groove 30 and then pressed into the groove around the entire perimeter of the housing. The gasket facing surface 18 of the first housing part 12 is then placed on the first housing facing surface 38 of the gasket 22. The rib 24 on the first housing part 12 is then pressed into the groove 28 in the first housing facing surface 38. As can be seen in FIG. 1, when a rib 24, 26 is seated in the corresponding groove 28, 30, the housing facing surfaces 38, 40 of the gasket 22 and the gasket facing surfaces 18, 20 of the housing parts are positioned in intimate contact with other. In addition, the inwardly facing surfaces 46 of the grooves 28, 30 and the outwardly facing surfaces 32, 34 of the ribs 24, 26 are positioned in intimate contact with each other so as to form an effective seal for the interface of the housing.

To facilitate the formation of the seal, each groove 28, 30 has a width w1 that is slightly less than the width w2 of the rib 24, 26 which it is designed to receive so that, when a rib is pressed into a groove, the rib displaces the elastomeric sides 46 of the grooves 28, 30 laterally with respect to the direction of insertion of the rib into the groove as can be seen in FIG. 1. This results in a kind of interference fit or friction fit engagement between the ribs of the housing parts and the grooves in the gasket which enhances the seal formed between the ribs and the grooves.

The lateral displacement D of the elastomeric gasket material generates a lateral force that is applied to each side of the rib due to the elasticity of the gasket material. The lateral clamping force is generated internally by the gasket and therefore does not require the use of an external device, such as a fastener, to generate and maintain the force. Therefore, essentially the only force required to establish and maintain the seal is the force required to press the rib on the housing part into the groove on the gasket.

Once the ribs 24, 26 on the housing parts 12, 14 are seated in the grooves 28, 30 in the gasket 22, the housing parts 12, 14 may be fastened to each other in any suitable manner that does not require the generation of a significant amount of compression. The force with which the housing parts 12, 14 are fastened together only needs to be enough to prevent the separation of the housing parts under normal conditions. The housing parts do not have to apply a compressing force to the gasket to establish and maintain the seal. Therefore, the housing parts 12, 14 may be fastened together with less force than is typically required. The reduction in closure force allows fewer fasteners to be used to fasten the housing parts together. The lower closure force also results in less stress on the housing parts which can extend the useful life of the housing.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A housing comprising:
    a first housing part defining a first interior housing portion and having a first interface edge that surrounds the first interior housing portion, the first interface edge having a first gasket facing surface and a first rib that protrudes from the first gasket facing surface around an entire perimeter of the housing;
    a second housing part defining a second interior housing portion and having a second interface edge that surrounds the second interior housing portion, the second interface edge being configured complementarily with respect to the first interface edge, the second interface edge having a second gasket facing surface and a second rib that protrudes from the second gasket facing surface around the entire perimeter; and
    a gasket configured to be interposed between the first interface edge and the second interface edge around an entire perimeter of the housing, the gasket having a first housing facing surface that faces in a first direction and a second housing facing surface that faces in a second direction that is opposite the first direction, the first housing facing surface defining a first groove shaped complementarily with respect to the first rib and the second housing facing surface defining a second groove shaped complementarily with respect to the second rib,
    wherein the gasket is formed entirely of an elastomeric material,
    wherein the gasket has an outer edge, the outer edge including an outwardly facing planar surface that extends between the first housing facing surface and the second housing facing surface and that faces outwardly from an interior of the housing,
    wherein the first housing part includes a first outer surface and the second housing part includes a second outer surface, and
    wherein the outwardly facing planar surface of the gasket is even with the first outer facing surface and the second outer surface when the first housing part, the second housing part and the gasket are assembled to form the housing.

2. The housing of claim 1, wherein the first housing part and the second housing part are formed of plastic.

3. The housing of claim 2, wherein the first rib is formed integrally with the first housing part on the first interface edge, and
    wherein the second rib is formed integrally with the second housing part on the second interface edge.

4. The housing of claim 1, wherein the first housing facing surface of the gasket is positioned in engagement with the first gasket facing surface of the first housing part and the first rib is received in the first groove, and
    wherein the second housing facing surface is positioned in engagement with the second gasket facing surface of the second housing part and the second rib is received in the second groove.

5. The housing of claim 4, wherein the first housing part is fastened to the second housing part with the gasket interposed between the first interface edge and the second interface edge.

6. The housing of claim 4, wherein the first rib has a first rib width and the second rib has a second rib width,
    wherein the first groove has a first groove width and the second groove has a second groove width, and
    wherein the first groove width is less than the first rib width and the second groove width is less than the second rib width.

7. The housing of claim 6, wherein the first rib width and the first groove width are selected so that the first rib has an interference fit with the first groove, and
    wherein the second rib width and the second groove width are selected so that the second rib has an interference fit with the second groove.

8. The housing of claim 6, wherein the first rib forms a seal with the first groove and the second rib forms a seal with the second groove.

* * * * *